United States Patent [19]

Partus

[11] 4,220,460
[45] Sep. 2, 1980

[54] VAPOR DELIVERY SYSTEM AND METHOD

[75] Inventor: Fred P. Partus, Atlanta, Ga.

[73] Assignee: Western Electric Company, Inc., New York, N.Y.

[21] Appl. No.: 9,565

[22] Filed: Feb. 5, 1979

[51] Int. Cl.² ............... C03C 25/02; C03B 37/00
[52] U.S. Cl. ........................... 65/3 A; 48/191; 65/13; 65/18; 73/204; 137/90; 261/39 E
[58] Field of Search ............. 65/3 A, 13, DIG. 7, 65/18; 48/191; 137/90; 261/39 E; 73/204

[56] References Cited

U.S. PATENT DOCUMENTS

| | | | |
|---|---|---|---|
| 3,771,260 | 11/1973 | Arenson | 48/190 |
| 3,826,560 | 7/1974 | Schultz | 65/3 A X |
| 3,859,073 | 1/1975 | Schultz | 65/3 A X |
| 3,938,384 | 2/1976 | Blair | 73/204 |
| 3,939,858 | 2/1976 | Lemay | 137/90 |
| 4,111,219 | 9/1978 | Hallberg et al. | 137/3 |

*Primary Examiner*—Robert L. Lindsay, Jr.

*Attorney, Agent, or Firm*—Robert B. Kennedy

[57] ABSTRACT

A system for generating and delivering vapors to a vapor deposition station is disclosed which comprises a bubbler 10 adapted to contain a supply of liquid, a bubbler heater 14 thermally coupled with the bubbler and electrically coupled with a heater controller, a temperature controlled chamber 23 located above the bubbler, and means 58,59 for heating the space within the temperature controlled chamber. A carrier gas intake conduit 27,28 extends through the temperature controlled chamber and down into the bubbler through which carrier gas may be introduced into the bubbler. A vapor exhaust conduit 41,49 extends upwardly from the bubbler and through the temperature controlled chamber through which vapors may be carried from the bubbler entrained with the carrier gas to the vapor deposition station. A sensor 52 is positioned within that portion of the vapor exhaust conduit located within the temperature controlled chamber and operatively coupled with the bubbler heater controller.

7 Claims, 3 Drawing Figures

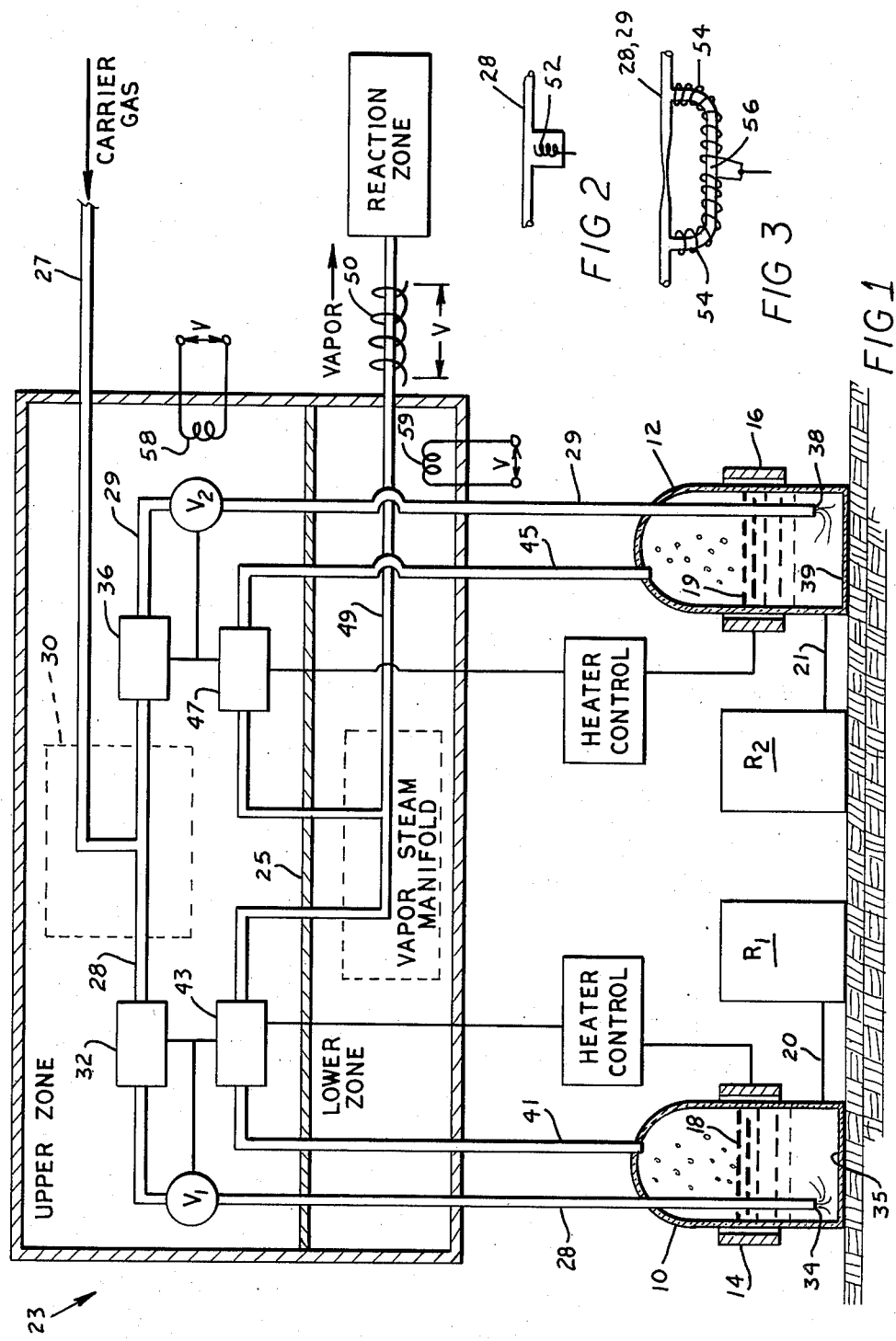

VAPOR DELIVERY SYSTEM AND METHOD

TECHNICAL FIELD

This invention relates to methods and systems for generating and delivering vapors to vapor deposition sites.

BACKGROUND OF THE INVENTION

With the advent of optical waveguides for use in the communications industry, much emphasis has recently been placed on vapor deposition as a materials forming technique. In constructing preforms from which optical fibers may be drawn, vapors of materials such as $SiCl_4$, $GeCl_4$, and $PoCl_3$ must be precisely blended and delivered at controlled mass flow rates to a preform construction site or station where they are reacted and deposited on or in a support. This can be done by passing carrier gases such as $H_2$, $He$, $N_2$, $O_2$, or $Ar$ through supplies of the materials in liquid form to the deposition site with the vapors entrained with the carrier gas. In performing this operation a group of vaporizors is normally used of the type known as bubblers. A bubbler has a chamber in which a gas intake conduit terminates with an outlet orifice located below the surface of liquid materials container therein. An outlet conduit communicates between the space above the surface of the liquid and the vapor deposition site. Exemplary of deposition systems employing bubblers is that illustrated in U.S. Pat. No. 3,826,560.

Heretofore a group of bubblers has typically been mounted within a temperature controlled chamber or oven together with associated conduits, manifolds, sensors and system control elements of which the vapor delivery system is comprised. By heating the entire temperature controlled chamber heat is provided to the liquids housed within the bubblers causing an accelerated rate of vaporization. Recently, it has been found that improved vapor delivery control may be achieved by individually controlling the heating of each bubbler in the group as through the use of individual heaters jacketed about each bubble. This however increases the risk of condensation forming in the system since significant temperature differentials may occur in the vapor stream from the bubblers that merge in the system manifolds causing the warmer of the streams to be cooled.

Where condensate is formed it may settle upon various sensors employed by the control system employed thereby producing false control signals. This will, in turn, erroneously alter the ratio of carrier gas to vapors delivered and the various vapor blend ratios. Should any condensate actually be delivered through the vapor system to the reaction zone itself a significant imperfection may be formed, particularly so since condensate may carry impurities to the deposition site. In addition, the placement of the bubblers within the temperature controlled chamber has rendered them less accessible for maintenance and blend alterations. It is to these problems which the present invention is directed.

SUMMARY OF THE INVENTION

In one form of the invention a system is provided for generating and delivering vapors to a vapor deposition station. The system comprises a vaporizer adapted to contain a supply of liquid, a heater thermally coupled with the vaporizer and electrically coupled with a heater controller, a temperature controlled chamber located above the vaporizer, and means for heating the space within the temperature controlled chamber. A carrier gas intake conduit extends through the temperature controlled chamber down into the vaporizer through which a carrier gas may be introduced into the vaporizer. A vapor exhaust conduit extends upwardly from the vaporizer and through the temperature controlled chamber through which vapors may be carrier from the vaporizer entrained with the carrier gas to the vapor deposition station. A vapor sensor is positioned within that portion of the vapor exhaust conduit located within the temperature controlled chamber and operatively coupled with the vaporizer heater controller.

In another form of the invention a system is provided for delivering a vapor blend to a vapor deposition site substantially uncontaminated with vapor condensate which system comprises a plurality of bubblers each having means for containing and heating liquids to form vapors. Means are provided for introducing a carrier gas into each of the bubblers. A temperature controlled chamber is located adjacent the bubblers and means provided for heating the space within the temperature controlled chamber. A manifold is mounted within the temperature chamber and means for providing fluid communication between the manifold within the temperature controlled chamber and the vapor deposition site. Conduits extends from each of the bubblers into the temperature controlled chamber where they are coupled with the manifold thereby providing fluid communication between the bubblers and the vapor deposition site.

In yet another form of the invention a method is provided for generating and delivering a vapor blend to a vapor deposition station substantially uncontaminated with vapor condensate. The method comprises the steps of heating liquids of diverse compositions disposed within a plurality of bubblers while bubbling carrier gases through the liquids. Vapors entrained with the carrier gases in vapor streams are conveyed from each of the bubblers upwardly through upright conduits whereby vapor condensate formed within the upright conduits may gravitate down into the bubblers. The vapor streams are merged into a common vapor stream and the common vapor stream conveyed to the vapor deposition station while continuously being heated.

BRIEF DESCRIPTION OF THE DRAWING

FIG. 1 is a schematic diagram of a vapor generating and delivering system embodying principles of the invention in one preformed form.

FIG. 2 is a schematic illustration of a sensor employed by the system shown in FIG. 1.

FIG. 3 is another schematic diagram of another sensor employed by the system depicted in FIG. 1.

DETAILED DESCRIPTION

Referring now in more detail to the drawing, there is shown in FIG. 1 a vapor delivery system which comprises a pair of bubblers 10 and 12 having resistance heaters 14 and 16 jacketed about their exterior surfaces. Each bubbler is partially filled with liquids of mutually different composition. The surfaces 18 and 19 of these liquids are maintained at substantially constant heights within the bubblers by relatively large reservoirs $R_1$, $R_2$ under head pressure in fluid communication therewith through conduits 22 and 21.

Above the bubblers is located a temperature controlled chamber 23 which is compartmentalized by a petition 25 into upper and lower zones or spaces. The bubblers themselves may, of course, also be located within some type of chamber provided that the temperature of the space within the bubblers is cooler than that within the other compartments. A carrier gas intake conduit 27 extends from an unshown supply of carrier gas into the upper zone of the temperature controlled chamber where it branches into two branch conduits 28 and 29 at a manifold 30. The branch conduit 28 is seen to extend through a sensors unit 32, a valve $V_1$, then downwardly through the lower zone of the chamber and into the bubbler 10, terminating with an outlet orifice 34 located beneath the surface 18 adjacent the bubbler bottom 35. Similarly, the other branch conduit 29 is also seen to extend through a sensors unit 36, a valve $V_2$, and then down through the lower zone of the chamber and into the bubbler 12, terminating with an outlet orifice 38 located adjacent the bubbler bottom 39.

With continued reference to FIG. 1 the vapor delivery system is further seen to include a vapor exhaust conduit 41 which extends upwardly from the upper portion of bubbler 10 into the temperature controlled chamber 23 passing first through the lower zone and then into the upper zone where it extends through a sensors unit 43 and then down into the lower zone to a vapor stream manifold. Similarly, another vapor exhaust conduit 45 extends upwardly from bubbler 12 into the temperature control chamber 23 also passing first through the lower zone then into the upper zone and through a sensors unit 47 before descending down into the lower zone to the vapor stream manifold. At the manifold the two vapor exhaust conduits merge into a common vapor exhaust conduit 49 which extends out of the lower zone of the chamber and to a vapor reaction zone where the vapor is deposited as in making an optical waveguide preform. In route to the reaction zone from the chamber the conduit is heated by a resistance heating element 50 coiled thereabout.

The sensors units 32 and 36 through which the carrier gas passes include a vapor-to-carrier gas ratio sensor in the form of an exposed, electrically conductive coil 52 as shown in FIG. 2, and a carrier gas flow rate sensor. The flow rate sensor includes a pair of electric resistance heating elements 54 wound in series about a sensor tube 56 which communicates with the carrier gas intake branch conduits 28 and 29 as shown in FIG. 3. Sensors units 43 and 47 similarly have a carrier gas to vapor ratio sensor in the form of an exposed conductive coil positioned within the flow stream of the carrier gas and vapor. These sensors within the units 32, 36, 43 and 47 are electrically connected through unshown control circuitry to a heater controller which controls the bubbler heaters 14 and 16. Exemplary control circuitry is illustrated in U.S. Pat. No. 3,938,384 and in pending patent application Ser. No. 967,806 filed Dec. 8, 1978, which is assigned to the assignee of the present invention. Operation of these sensors is effected by the flow of a gaseous stream over the surface of the conductive elements or through auxiliary sensor conduits about which heater elements are wound. Should vapor condensate be deposited upon the exposes sensor elements or upon the walls of the auxiliary conduits their operation may become severely impaired through the generation of false signals to the control circuitry. Further, contaminants may be dissolved in the liquid condensate and thus be carried off downstream.

In operation, liquid is supplied to the bubblers from the reservoirs and surface levels 18 and 19 established. The heaters 14 and 16 jacketed about the bubblers are then energized causing the liquids contained within the bubblers to be heated and vaporized under individual control. Carrier gas is introduced through the carrier gas conduits into the bubblers beneath the surfaces 18 and 19. During introduction the carrier gas is heated by passing through the temperature control chamber 23 which serves to avoid heat from being drawn by the carrier gas from the liquids. The carrier gas then rises to the surfaces of the liquids within the bubblers during which time vapor is also formed within the rising carrier gas bubbles. The vapors entrained with the carrier gas then exits the bubblers through the exhaust conduits 41 and 45.

As the vapor stream rises through the conduits 41 and 45 some condensate may form on the inside surface of the conduits since it is passing through a spacial environment at a relatively cooler temperature than that within the bubblers. Nevertheless, since the conduits are upwardly oriented condensate so formed will tend to gravitate back into the bubblers rather than enter the sensors units 43 and 47.

The vapor stream then passes into the temperature controlled chamber and into the upper chamber zone or space which is heated by a heater schematically shown at 58 to a temperature somewhat below that of the temperature of the lower zone which is heated by a heater 59. From here the stream passes through the sensor units 43 and 47 substantially free of condensate due both to the orientation of the conduits 41 and 45 beneath the temperature controlled chamber and to the fact that heat is being inputted into the stream within the chamber upper zone. The vapor stream is then directed downwardly into the lower zone, which is maintained at a somewhat higher temperature such as 5° to 10° F. than that of the upper zone, and to the vapor stream manifold. Here the two vapor streams from the two bubblers are combined into a single, common stream while being heated which common stream is directed out of the temperature controlled chamber. During this final passage from the manifold to the exterior of the chamber condensate is again inhibited from forming due to the fact that the lower zone is at a higher temperature than that of the upper zone whereby heat is continued to be conducted into the vapor stream. During its passage from the temperature controlled chamber itself to the reaction zone or deposition site heat is further inputted by the heater element 50 wound about the exterior of that portion of conduit 49 located exteriorly of the chamber.

It thus is now shown that a vapor delivery system and method is provided for generating and delivering vapor to a vapor reaction station substantially free of vapor condensate which could adversely interfere with both the vapor reaction as well as delivery control. The system and method enables bubblers to be maintained, if desired, at ambient room temperature where they may be readily accessable for maintenance. Of course if otherwise desired the bubblers may be maintained within a portion of the temperature controlled chamber itself if the space within the bubblers is maintained cooler than the vapor stream exhausted therefrom or by further chamber compartmentalization. Many other modifications, additions, and deletions may, of course, be made thereto without departure from the spirit and scope of the invention as set forth in the following claims.

What is claimed is:

1. A system for generating and delivering vapors to a vapor deposition station comprising, in combination, a vaporizer adapted to contain a supply of liquid; a vaporizer heater thermally coupled with said vaporizer and electrically coupled with a heater controller; a temperature controlled chamber located above said vaporizer; means for heating the space within said temperature controlled chamber; a carrier gas intake conduit extending through said temperature controlled chamber and down into said vaporizer through which a carrier gas may be introduced into said vaporizer; a vapor exhaust conduit extending upwardly from said vaporizer and through said temperature controlled chamber through which vapors may be carried from said vaporizer entrained with the carrier gas to the vapor deposition station; and a vapor sensor positioned within that portion of said vapor exhaust conduit located within said temperature controlled chamber and operatively coupled with said vaporizer heater controller.

2. A vapor delivery system in accordance with claim 1 wherein said temperature controlled chamber is compartmentalized into at least two spaces with one space being maintained relatively cool and another space relatively warm by said heater means; and wherein said vapor exhaust conduit passes through said cooler space between said vaporizer and said warmer space.

3. A vapor delivery system in accordance with claim 1 or 2 wherein said vaporizer is located in an ambient spacial environment below said temperature controlled chamber, and wherein said heater means maintains the temperature of the space within said temperature controlled chamber elevated above the temperature of said ambient spacial environment.

4. A system for delivering a vapor blend to a vapor deposition site substantially uncontaminated with vapor condensate which system comprises a plurality of bubblers each having means for containing and heating liquids to form vapors; means for introducing a carrier gas into each of said bubblers; a temperature controlled chamber located adjacent said plurality of bubblers compartmentalized into a plurality of spaces; means for heating the compartmentalized spaces within said temperature controlled chamber and for maintaining said spaces at mutually diverse temperatures; a manifold mounted within the warmer of said two spaces; means for providing fluid communication between said manifold and the vapor deposition site; and a conduit extending from each of said bubblers into said temperature controlled chamber wherein the said conduits are coupled with said manifold thereby providing fluid communication between the bubbler and the vapor deposition site and through the cooler of said two spaces between said bubblers and said manifold to inhibit the formation of condensates.

5. A vapor delivery system in accordance with claim 4 wherein said plurality of bubblers is located in an ambient special environment below said temperature controlled chamber, and wherein said heater means maintains the temperature of the space within said temperature controlled chamber elevated above the temperature of said ambient special environment.

6. A vapor delivery system in accordance with claim 5 wherein said means for introducing a carrier gas into said bubblers includes carrier gas conduits that pass through said temperature controlled chamber having outlet orifices located within each of said bubblers.

7. A vapor delivery system in accordance with claim 4 comprising means for controlling said bubbler heating means that includes a vapor sensor mounted within a portion of said conduits located within said temperature controlled chamber.

* * * * *